US008680453B2

(12) United States Patent
Roy

(10) Patent No.: US 8,680,453 B2
(45) Date of Patent: Mar. 25, 2014

(54) IMAGING DEVICE WITH CHARGE COLLECTION ZONE AND CHARGE STORAGE ZONE

(75) Inventor: François Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 216 days.

(21) Appl. No.: 13/183,949

(22) Filed: Jul. 15, 2011

(65) Prior Publication Data

US 2012/0018618 A1  Jan. 26, 2012

(30) Foreign Application Priority Data

Jul. 21, 2010 (FR) ...................................... 10 55962

(51) Int. Cl.
*H01L 27/00* (2006.01)
*H01L 31/00* (2006.01)

(52) U.S. Cl.
USPC ..................................... 250/208.1; 250/214.1

(58) Field of Classification Search
USPC .............. 250/208.1, 214.1; 257/72, 225, 292, 257/446
See application file for complete search history.

(56) References Cited

U.S. PATENT DOCUMENTS

| 2006/0138493 | A1 | 6/2006 | Shim et al. |
| 2009/0266973 | A1 | 10/2009 | Roy et al. |
| 2010/0002108 | A1 | 1/2010 | Mabuchi |
| 2010/0117126 | A1 | 5/2010 | Takahashi |
| 2010/0148221 | A1 * | 6/2010 | Yu et al. ........................ 257/225 |

OTHER PUBLICATIONS

République Française Institut National De La PropriétéIndustrielle, Rapport De Recherche Préliminaire (Preliminary Search Report); issued in French Patent Application No. 1055962 on Apr. 1, 2011 (2 pages).

* cited by examiner

*Primary Examiner* — Thanh Luu
*Assistant Examiner* — Renee Naphas
(74) *Attorney, Agent, or Firm* — Slater & Matsil, L.L.P.

(57) ABSTRACT

Imaging device comprising at least one photosite comprising a charge storage semiconductor zone, a charge collection semiconductor zone and transfer means designed to permit charge transfer between the charge storage zone and the charge collection zone, characterized in that the charge storage semiconductor zone comprises a lower semiconductor zone and a conduction channel buried beneath the upper surface of the photosite and connecting said lower semiconductor zone to the charge collection zone.

25 Claims, 7 Drawing Sheets

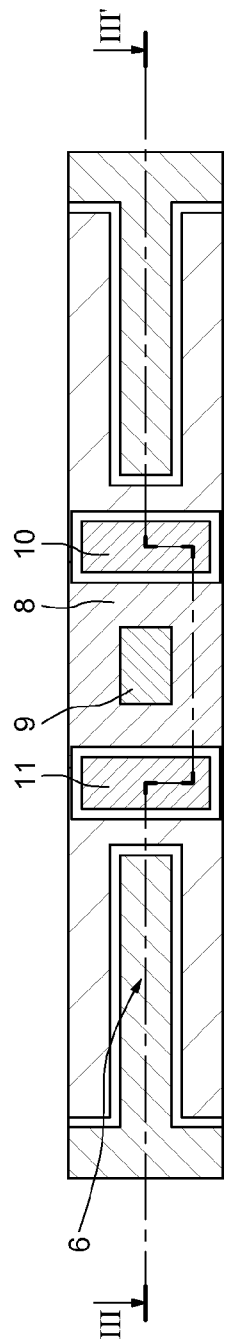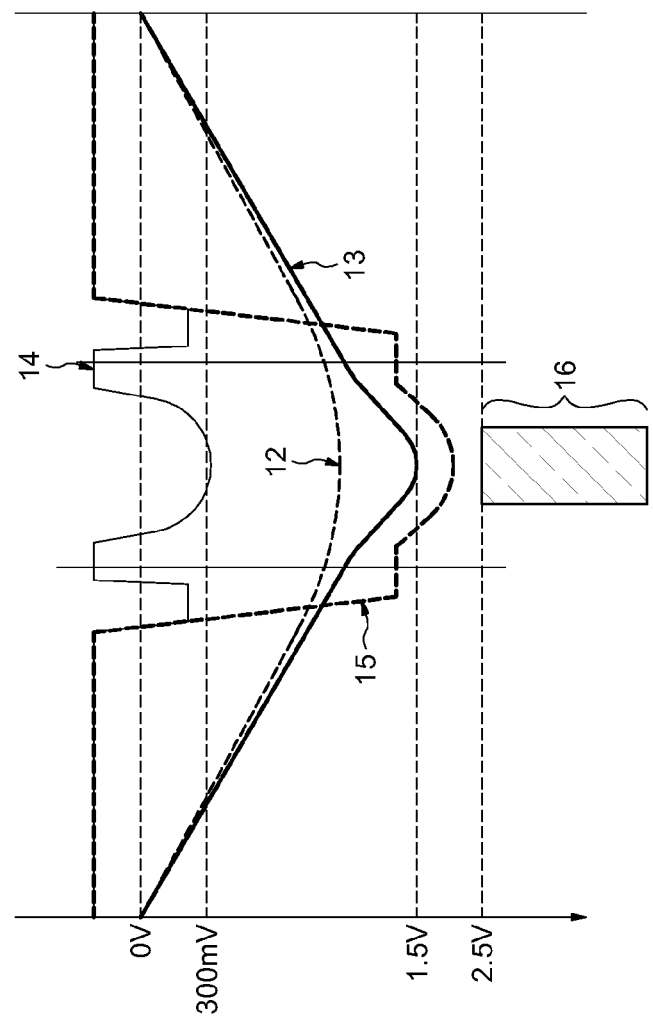
FIG.5

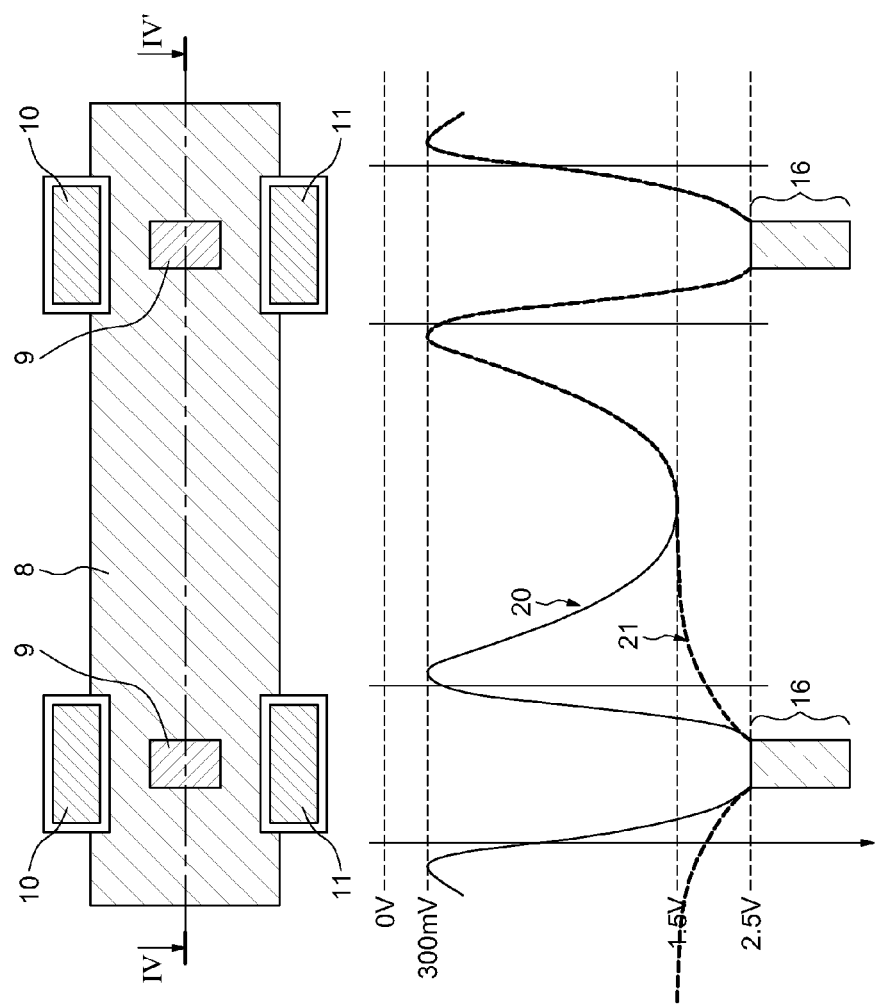

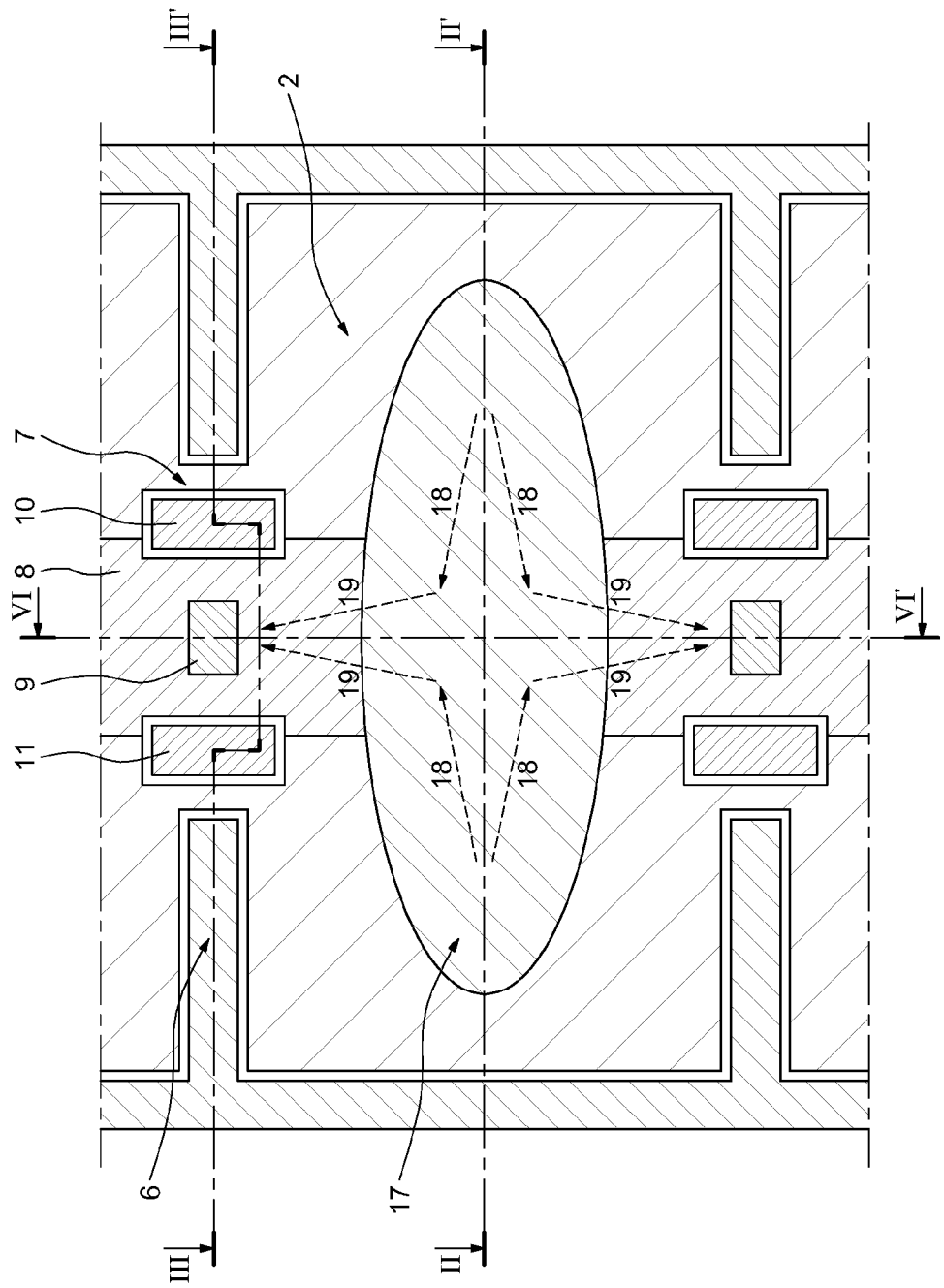

IMAGING DEVICE WITH CHARGE COLLECTION ZONE AND CHARGE STORAGE ZONE

CROSS-REFERENCE TO RELATED APPLICATION

This application claims the priority benefit of French patent application number 10-55962, filed Jul. 21, 2010, entitled "Imaging device having improved performance and method of controlling it," which is hereby incorporated by reference to the maximum extent allowable by law.

TECHNICAL FIELD

The invention relates to photosites, and more particularly to improving the performance of photosites.

BACKGROUND

A photosite comprises at least one photodiode and at least one isolation trench zone for isolating the photodiode(s).

Image sensors based on semiconductor components benefit from the principle of the conversion of photons into electron/hole pairs in silicon. More precisely, the charges created in the photosensitive zones are stored in the photodiode and then read by an electronic system. This electronic system, which controls the photodiode, comprises, especially when the photodiode is a fully-depleted photodiode, a transfer transistor permitting transfer of the charges stored in the photodiode to a charge collection zone. This charge collection zone forms a sensing node to which a conventional electronic control circuit comprising especially a read transistor is connected.

An imaging device generally comprises photodiodes arranged in a matrix. Each photodiode corresponds to a pixel of an image. The matrix comprises rows of semiconductor photodiodes, each row being bordered by deep isolation trenches. A deep isolation trench comprises a conductive internal portion surrounded by an insulating layer. A photodiode operates in a cycle comprising at least an integration step, a measurement step and a resetting step. The integration step corresponds to the photogeneration of charges and their accumulation during exposure of the photodiode. The measurement step corresponds to the generation of a signal that depends on the number of photogenerated charges accumulated in the photodiode. The resetting step corresponds to the removal of the photogenerated charges.

Under certain conditions, the number of electrons generated during the integration step may exceed the number of electrons that can be stored. If no precautions are taken, the electrons that can no longer be stored in the photodiode may then diffuse into the adjacent photodiodes of the photosite. This results visually in the generation of a white halo or white columns of increasing size on the image. This halo effect between adjacent pixels is called blooming.

Another drawback to which these devices may be afflicted is a lag, during the measurement phase, of the signal generated by each pixel due to the trapping of the electrons while they are being transferred between the deep storage layers and the surface (charge adsorption and re-emission).

SUMMARY OF THE INVENTION

According to one aspect, the invention provides an imaging device comprising at least one photosite comprising a charge storage semiconductor zone, a charge collection semiconductor zone and transfer means designed to permit charge transfer between the charge storage zone and the charge collection zone, in which device the charge storage semiconductor zone comprises a lower semiconductor zone and a conduction channel buried beneath the upper surface of the photosite and connecting said lower semiconductor zone to the charge collection zone.

According to another aspect, the invention defines a method of controlling an imaging device comprising at least one photosite, in which the charges photogenerated in the photosite are transferred to a charge collection zone via a buried conduction channel.

BRIEF DESCRIPTION OF THE DRAWINGS

Other objects, features and advantages will become apparent on reading the following description given solely by way of non-limiting example and with reference to the appended drawings in which:

FIG. 5 illustrates the structure of one embodiment of the device in the vicinity of the plane of section III-III' of FIG. 1 and the resulting variation in the potential energy;

FIG. 6 illustrates the structure of one embodiment of the device in the vicinity of the plane of section VI-VI' of FIG. 1 and the resulting variation in the potential energy; and FIG. 7 illustrates the various phases in the collection and detection of the photogenerated charges according to one embodiment of the device.

DETAILED DESCRIPTION OF ILLUSTRATIVE EMBODIMENTS

Figure 1:
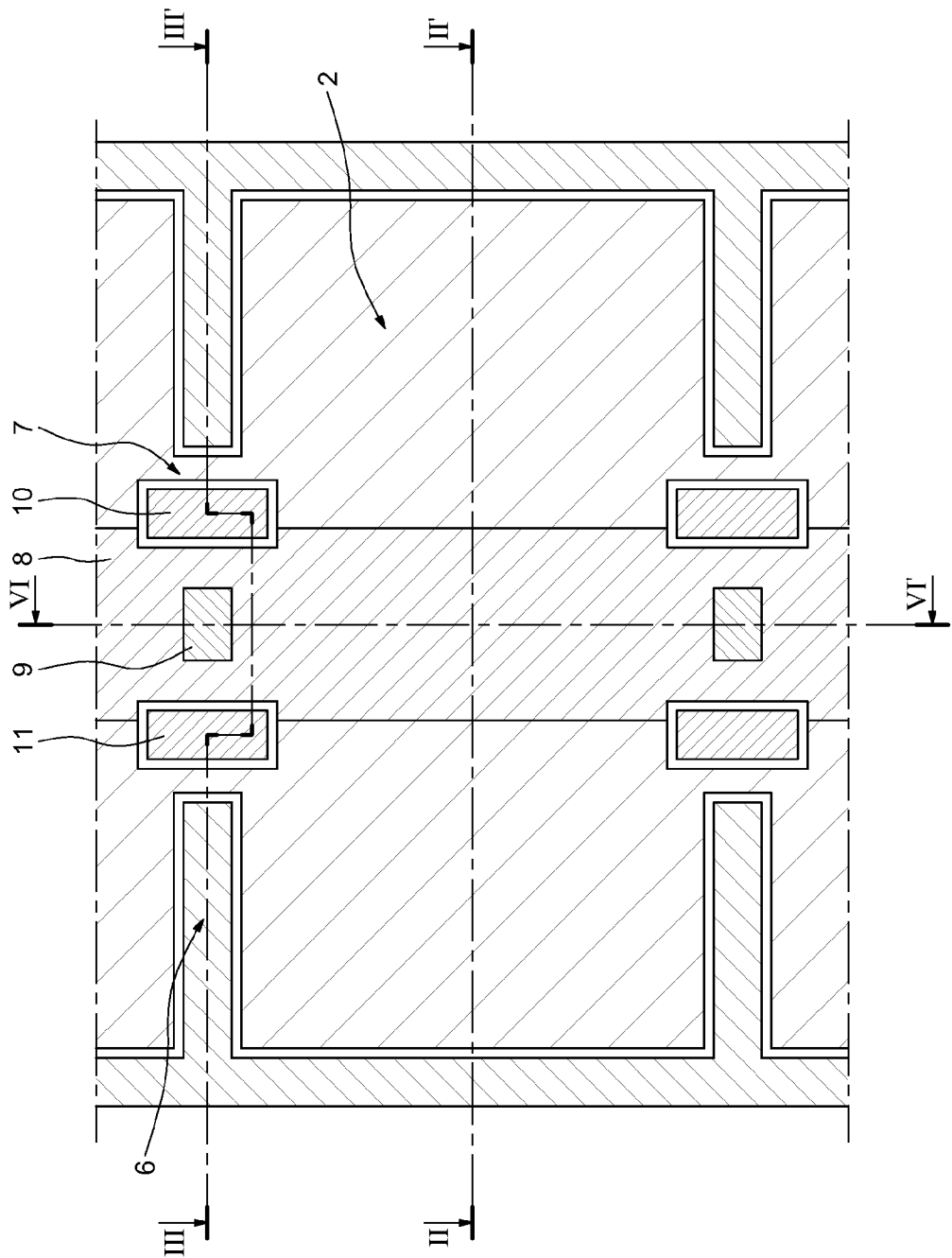
FIG. 1 illustrates a row of photosites according to one embodiment of the invention.

Before describing the illustrated embodiments in detail, various embodiments and advantageous features will be described generally. According to one implementation and one embodiment of the invention, a method and a device are provided that make it possible to reduce, or even eliminate, the lag during the measurement phase.

According to another implementation and another embodiment of the invention, a method and a device are provided that make it possible to reduce, or even eliminate, the blooming effect when the number of charges accumulated in a photosite exceeds the capacity of said photosite.

According to one aspect, the invention provides an imaging device comprising at least one photosite comprising a charge storage semiconductor zone, a charge collection semiconductor zone and transfer means designed to permit charge transfer between the charge storage zone and the charge collection zone, in which device the charge storage semiconductor zone comprises a lower semiconductor zone and a conduction channel buried beneath the upper surface of the photosite and connecting said lower semiconductor zone to the charge collection zone. Such a channel makes it possible to prevent the generated signal from being delayed by charge absorption and re-emission.

The conduction channel may have the same type of conductivity as that of said lower semiconductor zone and of the charge collection zone, and the doping of the conduction channel may be greater than the doping of the lower semiconductor zone but lower than the doping of the charge collection zone.

The conduction channel may have a smaller depth than that of the charge collection zone. The conduction channel may have a portion surrounding the upper portion of the charge collection zone.

The photosite may be bounded by a deep isolation trench having an aperture in which the charge collection zone may be produced, it being possible for the conduction channel to extend through said aperture.

The transfer means may comprise two electrically conductive insulated gates extending vertically on either side of the charge collection zone and separated from the latter by portions of the conduction channel.

It is also possible for an asymmetric potential well to be created locally around the conduction channel enabling the excess electrons, that cannot be stored, to be directed to the charge collection zone acting as drain. The blooming effect is therefore limited or even eliminated.

According to one embodiment, the device furthermore comprises a matrix of photosites comprising rows of photosites, each row comprising a continuous lower semiconductor layer, containing said lower semiconductor zones of the photosites of the row, and a continuous upper semiconductor zone containing the buried conduction channels of the photosites of the row.

According to another aspect, the invention defines a method of controlling an imaging device comprising at least one photosite, in which the charges photogenerated in the photosite are transferred to a charge collection zone via a buried conduction channel.

The potential energy around the conduction channel in the vicinity of the charge collection zone may be locally modified in such a way that this modified potential energy is lower than the potential energy in the peripheral portion of the charge storage zone.

The photosite may comprise at least two insulated gates extending vertically on either side of the conduction channel and of the charge collection zone, the photosite being bounded over at least a portion of its periphery by a deep isolation trench, in which the potential energy may be locally modified by applying a potential difference between the insulated gates and the deep isolation trenches.

Figure 2:
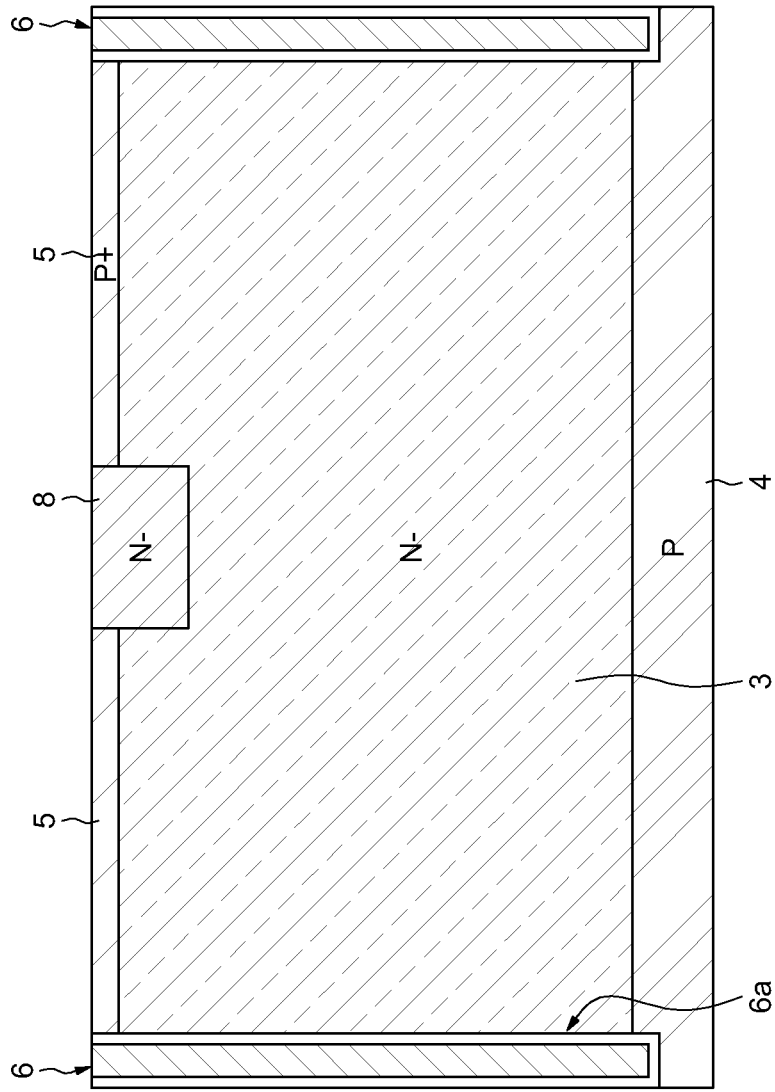
FIG. 2 is a sectional view of one embodiment of the device in the plane of section II-II' of FIG. 1.
Figure 3:
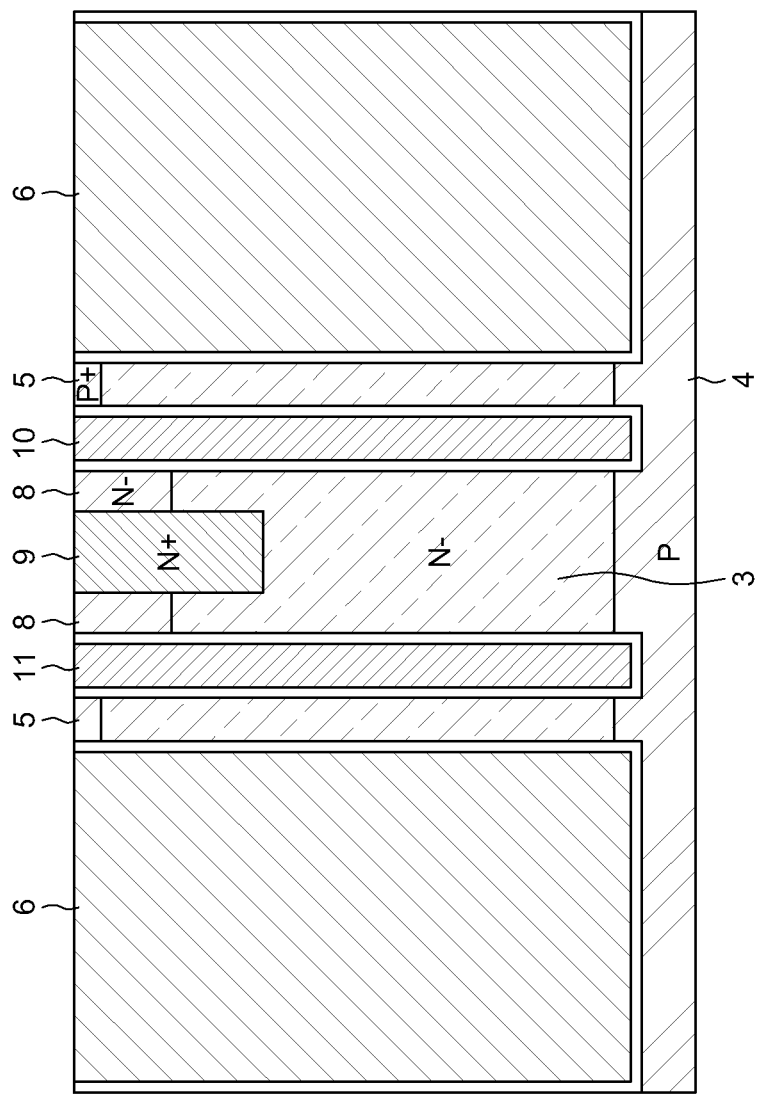
FIG. 3 is a sectional view of one embodiment of the device in the plane of section III-III' of FIG. 1.

Referring now to FIG. 1, which illustrates a top view of a row of photosites involved in the formation of an imaging device, and also to FIGS. 2 and 3, it may be seen that the row of photosites is isolated from the environment by deep isolation trenches 6. Two photosites placed consecutively in a row are also separated by a deep isolation trench 6 in which an aperture 7 is provided.

A semiconductor layer, for example made of silicon, n⁻-doped with $10^{16}$ atoms/cm³ to $10^{17}$ atoms/cm³, typically $5 \times 10^{16}$ atoms/cm³, called the lower layer 3, is located on a semiconductor substrate 4, p doped with $10^{14}$ atoms/cm³ to $10^{19}$ atoms/cm³, typically $10^{15}$ atoms/cm³. A semiconductor layer 5, p⁺-doped with $10^{16}$ atoms/cm³ to $10^{18}$ atoms/cm³, typically $5 \times 10^{17}$ atoms/cm³, is formed on the lower layer 3. The doped semiconductor 4 and the lower layer 3 form a first photodiode 2, the upper layer 5 and the lower layer 3 forming a second photodiode. The doped layer 5 also makes it possible to passivate the surface of the photosite and to reduce thermally induced charge generation.

For each row of photosites, the imaging device comprises a charge storage zone for each photosite and a charge collection zone 9 for each pair of photosites.

A conduction channel 8 is formed beneath the surface of the device, whereas two deep isolation trenches 6 extend vertically right into the doped semiconductor substrate 4. The conduction channel 8 has a thickness greater than the thickness of the doped semiconductor layer 5. The lower layer 3 and the conduction channel 8 form the charge storage zone.

The conduction channel 8 extends continuously over the length of the row and extends from one photosite to the next by passing through the aperture 7 provided in the deep isolation trench 6 between two consecutive photosites.

The charge collection zone 9 is located in the aperture 7 provided in the deep isolation trench 6 between two consecutive photosites. It is partly formed in the conduction channel 8. The conduction channel 8 surrounds the charge collection zone 9 in a plane parallel to the surface of the device. The charge collection zone 9 is narrower but deeper than the conduction channel 8. The charge collection zone 9 is made of n⁺-doped silicon, which is more highly doped than the n⁻-doped silicon within the conduction channel 8 having $5 \times 10^{15}$ atoms/cm³ to $10^{17}$ atoms/cm³, typically $10^{16}$ atoms/cm³.

An insulated gate is placed on each side of the charge collection zone 9. An insulated gate comprises an electrically conductive internal portion surrounded by an insulating layer. The insulated gates (10, 11) are placed essentially to the outside of the conduction channel 8. Each insulated gate (10, 11) extends on the surface of the device right into the doped semiconductor substrate 4. These insulated gates (10, 11) serve to block or unblock the transfer of charges between the conduction zone 8 and the charge collection zone 9, depending on the potential which is applied thereto.

The deep isolation trenches 6 are biased in such a way that the interface regions 6a are at the reference potential corresponding for example to the potential of the semiconductor substrate 4. From a functional standpoint, the conduction channel 8, the charge collection zone 9 and the insulated gates (10, 11) form the source, drain and gate of a transfer transistor. The charge collection zone 9 is connected to the electronic circuit for controlling the imaging device, especially to the gate of a read transistor and to the source of a resetting transistor. In other words, the insulated gates (10, 11) form part of the transfer means capable of controlling the transfer of electrons into the charge collection zone 9.

According to a general principle, charges in a potential field spontaneously move into positions that minimize their potential energy. It will also be recognized that the potential energy is equal to the product of the charge multiplied by the electrostatic potential. An electron has a negative charge and minimizes its energy by moving towards increasing electrostatic potentials. A hole has a positive charge and minimizes its energy by moving towards decreasing electrostatic potentials.

Figure 4:
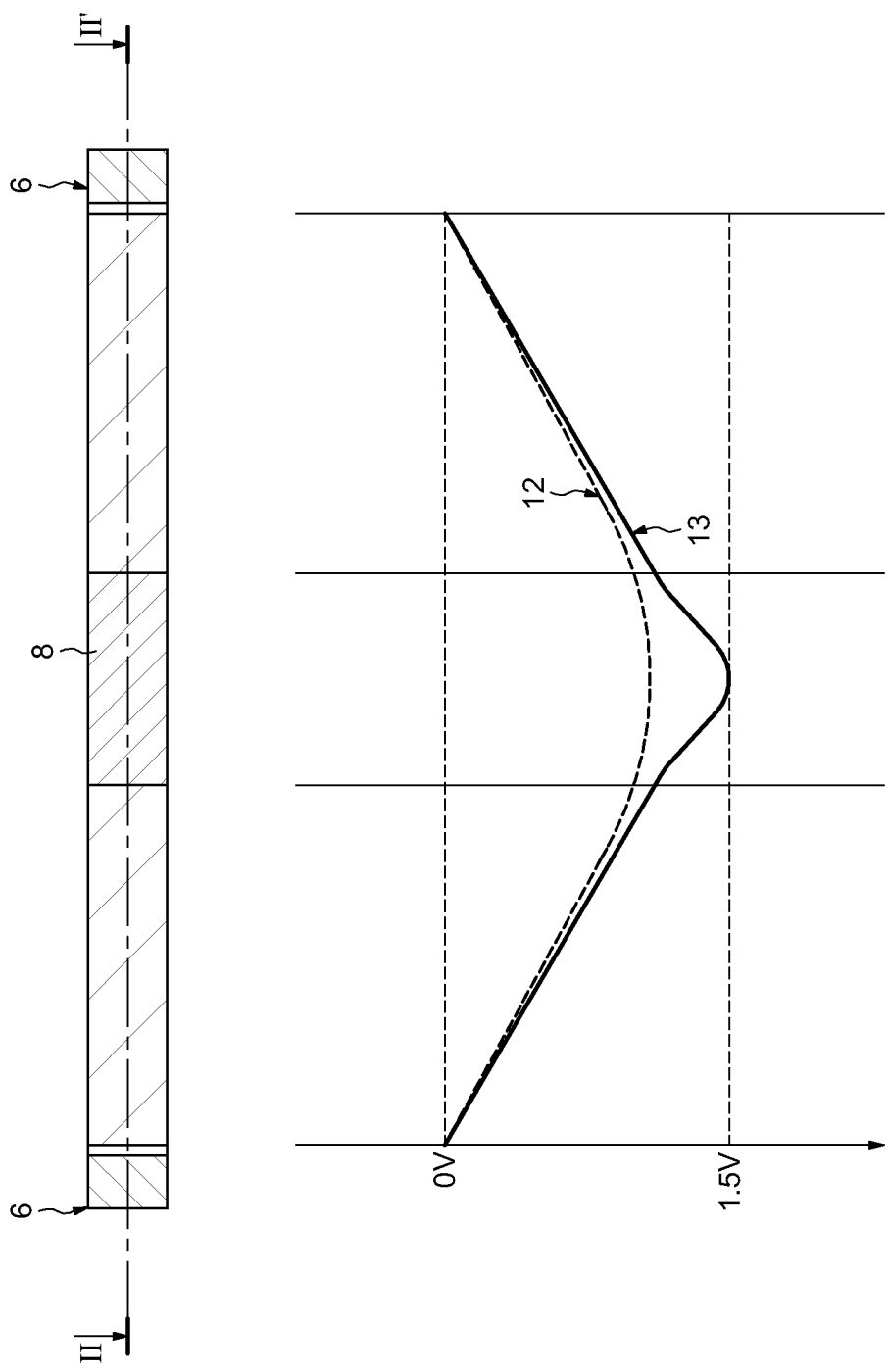
FIG. 4 illustrates the structure of one embodiment of the device in the vicinity of the plane of section II-II' of FIG. 1 and the resulting variation in the potential energy.

FIGS. 4 to 6 illustrate the variations in potential energy when the photogenerated charges are electrons. For simplicity of reading, the vertical axis in these figures refers to electrostatic potentials. As explained above, in the case of an electron the potential energy is equal to the product of the electrostatic potential multiplied by the opposite of the elementary charge. This axis has been chosen to be directed downwards in each figure so as to make it easier to understand how the electrons move. The zones of lower potential energy are located at the bottom of the figure, whereas the zones of higher potential energy are located at the top.

In the case of a device operating with holes, the potentials to be considered would be of opposite sign to those presented below.

FIG. 4 illustrates the variation in potential energy generated by the various layers of materials within the device, which potentials are applied to the photogenerated charges. The upper part of FIG. 4 shows the structure of the device in the vicinity of the plane of section II-II', seen from above. The lower part of FIG. 4 shows schematically the variation in potential energy as a function of the position along the line depicted by the indicators II-II'. In this figure, curve 12 depicts the variation in potential energy in the absence of the conduction channel 8, while curve 13 depicts the variation in potential energy in the presence of the conduction channel 8. The latter curve therefore constitutes a realistic, albeit simplified, representation of the variation in potential.

It follows from comparing curve 12 with curve 13 that the curve illustrating the variation in potential energy is inflected at a minimum located plumb with the conduction channel 8. Such a variation in potential energy is commonly referred to as a potential well. From this it may therefore be concluded that, without any external influence, the photogenerated charges have a tendency to concentrate in the conduction channel 8.

It may be seen that the ends of the potential well corresponding to the conduction channel 8 are (in the interface region 6a of the deep isolation trenches 6) at the reference potential of the substrate, for example 0 V. Two adjacent photosites are physically separated by a deep isolation trench that includes an aperture. The deep isolation trench comprises a conductive portion surrounded by a dielectric portion. The deep isolation trench is biased in such a way that the interface between the dielectric portion and the doped silicon can achieve the reference potential of zone 4, namely a potential equal to 0 V.

FIG. 5 illustrates the variation in potential energy in the plane of section III-III' shown in FIG. 1. As a reference, the upper part of Claim 5 shows the structure of the device in the vicinity of the plane of section III-III', seen from above. The lower part of FIG. 5 shows schematically the variation in potential energy as a function of the position along the line depicted by the indicators III-III'. Curve 12 and curve 13 are repeated here for comparison with FIG. 4. Curve 14 depicts the variation in potential energy when a low-state gate voltage is applied to the insulated gates (10, 11). In this situation, the insulated gates (10, 11) generate a potential barrier that prevents charge transfer. Curve 15 depicts the variation in potential when a high-state gate voltage is applied to the insulated gates (10, 11). In this situation, the insulated gates (10, 11) do not generate a potential barrier.

By comparing curves 14 and 15 it is apparent that the applied gate voltage serves to control the potential energy in the zone between the insulated gates (10, 11). More precisely, the charge collection zone 9 behaves as a charge storage capacitor likened to a potential well shown schematically by the zone 16. When a low-state potential is applied to the insulated gates (10, 11), a potential barrier forms around the potential well of the charge collection zone 9.

When a high-state potential is applied to the insulated gates (10, 11), the potential barrier around the potential well of the charge collection zone 9 disappears. The photogenerated charges present in the conduction zone 8 are then attracted into the charge collection zone 9.

FIG. 6 illustrates the variation in potential along the line VI VI' of FIG. 1. For reference, the upper part of FIG. 6 shows the structure of the device in the vicinity of the plane of section VI-VI', seen from above. The lower part of FIG. 6 shows schematically the variation in potential energy as a function of the position along the line depicted by the indicators VI-VI'. The line VI-VI' passes through two successive charge collection zones 9 that are connected via the same conduction channel 8.

Curve 20 illustrates the potential energy in the device when low-state voltages are applied to the two pairs of insulated gates (10, 11) generating potential barriers on either side of the conduction channel 8. As may be seen, the potential barriers prevent the charges accumulated in the conduction channel 8 from passing into the charge collection zones 9.

Curve 20 shows that the potential energy of the potential barrier in the insulated gates (10, 11) is below the potential energy in the deep isolation trenches 6. The potential well corresponding to the conduction channel 8 is thus bordered on two opposite sides (i.e. on the periphery of the charge storage zone) by a 0 V potential barrier (FIG. 4) and on the other two sides by a 300 mV potential barrier. Thus, in the case of excessive filling of the photosite, the charges will spill over via the barriers of lower potential energy, here the 300 mV barriers. The excess charges will spill over into the potential well in the charge collection zone 9. Furthermore, during the integration phase in which the charges are photogenerated, the charge collection zone 9 is connected to a draining zone. It is then possible to eliminate the excess charge in the draining zone via the charge collection zone 9. The proposed device thus makes it possible to limit the blooming effect, or even to prevent it.

Curve 21 illustrates the potential barriers created in the insulated gates (10, 11) relative to the potential energy in the conduction channel 8 when the high-state potential is applied to the pair of insulated gates (10, 11) on the left and a low-state potential is applied to the pair of insulated gates (10, 11) on the right. In practice, this corresponds to the potential barrier generated by the pair of insulated gates (10, 11) on the left being lowered. The charges accumulated in the potential well facing the conduction channel 8 then move spontaneously into the charge collection zone 9 on the left, the potential barrier of which has been lowered.

FIG. 7 illustrates the various photogenerated charge storage and collection phases. During a first phase, charges 17 are photogenerated. These photogenerated charges 17 are subjected to the potentials illustrated in FIGS. 4 and 5. The photogenerated charges in the photosite therefore migrate towards the conduction channel 8. These movements are shown symbolically by the arrows 18. During a second phase, a gate potential corresponding to the high state is applied to the insulated gates (10, 11). The topography of the potentials is modified in such a way that the photogenerated charges in addition to being attracted towards the conduction channel 8 are attracted towards the charge collection zone 9. The charges already present in the conduction channel 8 are also attracted towards the charge collection zone 9. These movements are shown symbolically by the arrows 19.

Thus, it may be seen that the photogenerated charges do not pass at any moment via the surface. They are therefore not subjected to capture and re-emission that may generate a lag in the signal from the photosite Likewise, the conduction channel 8 through which the charges pass allows volume conduction. The trapping effects are therefore limited to the interface with the oxide of the insulated gates. Moreover, during the photogenerated charge measurement phases, the charge collection zone 9 is at a floating potential, which is at a potential above the maximum potential obtained when the lower layer 3 and the conduction channel 8 of the photodiodes are fully depleted of carriers. The method of controlling the photosite enables the photogenerated charges to be transferred into the charge collection zone so as to generate the measurement signal.

During operation of an imager comprising a matrix of photosites, the charge detection zones are activated one after another by lowering the potential barriers surrounding them. The charges accumulated in the two adjacent photosites then flow away into the active charge collection zone 9. To discriminate which adjacent photosite the charges come from, each row is provided with a first photosite the signal from which is not considered. This first photosite is subjected to a resetting operation by means known to those skilled in the art, for example by draining the photogenerated charges. During activation of the first charge detection zone lying between the first and second photosites, only the second photosite contains photogenerated charges. The signal coming from the first charge collection zone 9 is directly dependent on the charges accumulated in the second photosite. During activation of the second charge collection zone 9 between the second and third photosites, the second photosite has been emptied of its charges in the manner described above. The signal from the second charge collection zone 9 is then directly dependent on the charges accumulated in the third photosite. The activation of the charge collection zones 9 continues in sequence until all the charge collection zones have been activated. The row is then available for a new integration phase.

What is claimed is:

1. An imaging device comprising a photosite, the photosite comprising:
    a charge collection semiconductor zone,
    a charge storage semiconductor zone comprising a lower semiconductor zone and a doped conduction channel buried beneath an upper surface of the photosite and conductively connecting said lower semiconductor zone to the charge collection semiconductor zone; and
    at least two electrically conductive insulated gates extending vertically on either side of the charge collection semiconductor zone and separated from the charge collection semiconductor zone by portions of the conduction channel, the electrically conductive insulated gates configured to permit charge transfer between the charge storage semiconductor zone and the charge collection semiconductor zone.

2. The device according to claim 1, wherein the conduction channel has a portion surrounding the upper portion of the charge collection semiconductor zone.

3. The device according to claim 1, wherein the photosite is bounded by a deep isolation trench having an aperture in which the charge collection semiconductor zone is located, the conduction channel extending through said aperture.

4. An imaging device comprising a photosite, the photosite comprising:
    a charge collection semiconductor zone,
    a charge storage semiconductor zone comprising a lower semiconductor zone and a conduction channel buried beneath an upper surface of the photosite and conductively connecting said lower semiconductor zone to the charge collection semiconductor zone; and
    at least two electrically conductive insulated gates extending vertically on either side of the charge collection semiconductor zone and separated from the charge collection semiconductor zone by portions of the conduction channel, the electrically conductive insulated gates configured to permit charge transfer between the charge storage semiconductor zone and the charge collection semiconductor zone, wherein the conduction channel has the same type of conductivity as that of said lower semiconductor zone and of the charge collection semiconductor zone, the doping of the conduction channel being greater than the doping of the lower semiconductor zone and lower than the doping of the charge collection semiconductor zone.

5. An imaging device comprising a photosite, the photosite comprising:
    a charge collection semiconductor zone,
    a charge storage semiconductor zone comprising a lower semiconductor zone and a conduction channel buried beneath an upper surface of the photosite and conductively connecting said lower semiconductor zone to the charge collection semiconductor zone; and
    at least two electrically conductive insulated gates extending vertically on either side of the charge collection semiconductor zone and separated from the charge collection semiconductor zone by portions of the conduction channel, the electrically conductive insulated gates configured to permit charge transfer between the charge storage semiconductor zone and the charge collection semiconductor zone, wherein the conduction channel has smaller depth than that of the charge collection semiconductor zone.

6. An imaging device comprising a photosite, the photosite comprising:
    a charge collection semiconductor zone,
    a charge storage semiconductor zone comprising a lower semiconductor zone and a conduction channel buried beneath an upper surface of the photosite and conductively connecting said lower semiconductor zone to the charge collection semiconductor zone; and
    at least two electrically conductive insulated gates extending vertically on either side of the charge collection semiconductor zone and separated from the charge collection semiconductor zone by portions of the conduction channel, the electrically conductive insulated gates configured to permit charge transfer between the charge storage semiconductor zone and the charge collection semiconductor zone, wherein the imaging device comprises a matrix of photosites comprising rows of photosites, each row comprising a continuous lower semiconductor layer, containing said lower semiconductor zones of the photosites of the row, and a continuous upper semiconductor zone containing the buried conduction channels of the photosites of the row.

7. A method of controlling an imaging device comprising at least one photosite, in which charges photogenerated in the photosite are transferred to a charge collection zone via a buried conduction channel, in which the potential energy around the conduction channel in the vicinity of the charge collection zone is locally modified in such a way that this modified potential energy is lower than the potential energy in the peripheral portion of a charge storage zone, and in which the photosite comprises at least two insulated gates extending vertically on either side of the conduction channel and of the charge collection zone, the photosite being bounded over at least a portion of its periphery by a deep isolation trench, in which the potential energy is locally modified by applying a potential difference between the insulated gates and the deep isolation trenches.

8. An imaging device comprising:
    a charge generation zone;
    a charge storage zone in communication with the charge generation zone and comprising a lower semiconductor layer and a buried conduction channel;
    an isolation region substantially surrounding the charge generation zone, and having an aperture therethrough;
    a charge collection zone located in the aperture and in communication with the charge storage zone; and a transfer device located in the aperture and in communication with the buried conduction channel, the transfer device configured to form a potential barrier at the buried conduction channel when in a first state and to not form the potential barrier at the buried conduction channel when in a second state.

9. The device of claim 8 wherein the charge generation zone comprises a first p-n junction of semiconductor materials.

10. The device of claim 9 wherein the first p-n junction comprises a substrate of a first conductivity type with an overlying first semiconductor layer of a second conductivity type.

11. The device of claim 10 wherein the charge generation zone further comprises a second p-n junction comprising the first semiconductor layer and an overlying second semiconductor layer of the first conductivity type.

12. The device of claim 10 wherein the isolation region comprises a deep isolation trench including a conductive material surrounded by an insulating material, the trench extending through the first semiconductor layer and to the substrate.

13. The device of claim 12 wherein the trench extends into the substrate.

14. The device of claim 10 wherein the charge storage zone comprises the first semiconductor layer and the buried conduction channel.

15. The device of claim 14 wherein the buried conduction channel is of the second conductivity type and wherein the charge collection zone is of the second conductivity type and having a higher dopant concentration than the conduction channel.

16. The device of claim 8 wherein the transfer device comprises an insulated gate.

17. An imaging device comprising:
a charge generation zone;
a charge storage zone in communication with the charge generation zone and comprising a lower semiconductor layer and a buried conduction channel;
an isolation region substantially surrounding the charge generation zone, and having an aperture therethrough;
a charge collection zone located in the aperture and in communication with the charge storage zone; and
a transfer device located in the aperture and in communication with the buried conduction channel, the transfer device configured to form a potential barrier at the buried conduction channel when in a first state and to not form the potential barrier at the buried conduction channel when in a second state;
wherein the transfer device comprises an insulated gate; and
wherein the insulated gate comprises a conductive material surrounded by an insulating layer, the insulated gate extending through a first semiconductor layer to an underlying substrate.

18. The device of claim 17 wherein the insulated gate extends into the substrate.

19. A method of controlling an imaging device comprising a photosite that comprises at least two insulated gates extending vertically on either side of a conduction channel and of a charge collection zone, the photosite being bounded over at least a portion of its periphery by a deep isolation trench, the method comprising:
receiving radiation at the photosite;
transferring charges photogenerated in the photosite to the charge collection zone via a doped buried conduction channel; and
during the transferring, locally modifying the potential energy around the conduction channel in the vicinity of the charge collection zone in such a way that this modified potential energy is lower than the potential energy in the peripheral portion of a charge storage zone, wherein the potential energy is locally modified by applying a potential difference between the insulated gates and the deep isolation trenches.

20. An imaging device comprising a photosite, the photosite comprising:
a charge collection semiconductor zone,
a charge storage semiconductor zone comprising a lower semiconductor zone and a doped conduction channel buried beneath an upper surface of the photosite and connecting said lower semiconductor zone to the charge collection semiconductor zone; and
transfer means for controlling charge transfer between the charge storage semiconductor zone and the charge collection semiconductor zone.

21. The device according to claim 20, wherein the conduction channel has the same type of conductivity as that of the lower semiconductor zone and of the charge collection semiconductor zone, the doping of the conduction channel being greater than the doping of the lower semiconductor zone and lower that the doping of the charge collection semiconductor zone.

22. The device according to claim 20, wherein the conduction channel has a portion surrounding an upper portion of the charge collection semiconductor zone.

23. The device according to claim 20, wherein the photosite is bounded by a deep isolation trench having an aperture in which the charge collection semiconductor zone is located, the conduction channel extending through the aperture.

24. The device according to claim 20, wherein the imaging device comprises a matrix of photosites comprising rows of photosites, each row comprising a continuous lower semiconductor layer, containing the lower semiconductor zones of the photosites of the row, and a continuous upper semiconductor zone containing the buried conduction channels of the photosites of the row.

25. An imaging device comprising a photosite, the photosite comprising:
a charge collection semiconductor zone;
a charge storage semiconductor zone comprising a lower semiconductor zone and a conduction channel buried beneath an upper surface of the photosite and connecting said lower semiconductor zone to the charge collection semiconductor zone; and
transfer means for controlling charge transfer between the charge storage semiconductor zone and the charge collection semiconductor zone, wherein the conduction channel has a smaller depth than that of the charge collection semiconductor zone.

* * * * *

UNITED STATES PATENT AND TRADEMARK OFFICE
CERTIFICATE OF CORRECTION

PATENT NO. : 8,680,453 B2  
APPLICATION NO. : 13/183949  
DATED : March 25, 2014  
INVENTOR(S) : Francois Roy Page 1 of 1

It is certified that error appears in the above-identified patent and that said Letters Patent is hereby corrected as shown below:

In the Claims:

In Col. 8, line 47, claim 7, delete "buried conduction" and insert --doped buried conduction--.
In Col. 8, line 63, claim 8, delete "buried conduction" and insert --doped buried conduction--.
In Col. 10, line 31, claim 21, delete "that the doping" and insert --than the doping--.

Signed and Sealed this
Twenty-seventh Day of May, 2014

Michelle K. Lee
*Deputy Director of the United States Patent and Trademark Office*